US010832933B1

(12) United States Patent
Brodoceanu et al.

(10) Patent No.: US 10,832,933 B1
(45) Date of Patent: Nov. 10, 2020

(54) DRY-ETCHING OF CARRIER SUBSTRATE FOR MICROLED MICROASSEMBLY

(71) Applicant: Facebook Technologies, LLC, Menlo Park, CA (US)

(72) Inventors: Daniel Brodoceanu, Saarbrucken (DE); Oscar Torrents Abad, Saarbrucken (DE)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 15/943,558

(22) Filed: Apr. 2, 2018

(51) Int. Cl.
  *H01L 21/683* (2006.01)
  *H01L 33/62* (2010.01)
  *H01L 21/3065* (2006.01)
  *H01L 21/67* (2006.01)
  *H01L 25/075* (2006.01)

(52) U.S. Cl.
  CPC .... *H01L 21/6835* (2013.01); *H01L 21/67132* (2013.01); *H01L 21/67144* (2013.01); *H01L 25/0753* (2013.01); *H01L 33/62* (2013.01); *C08J 2300/00* (2013.01); *H01L 2221/68354* (2013.01); *H01L 2221/68363* (2013.01); *H01L 2221/68381* (2013.01); *H01L 2933/0066* (2013.01)

(58) Field of Classification Search
  CPC ..... B08B 7/0035; B32B 38/10; B32B 38/105; B32B 43/006; B65G 49/067; C08J 7/123; C08J 2300/00; H01L 21/6835; H01L 21/6836; H01L 2221/68304–68377; H01L 2221/68381–68395
  See application file for complete search history.

(56) References Cited

U.S. PATENT DOCUMENTS

| 6,613,610 | B2* | 9/2003 | Iwafuchi | H01L 24/82 438/128 |
|---|---|---|---|---|
| 2002/0064032 | A1* | 5/2002 | Oohata | H04N 9/30 361/760 |
| 2005/0112885 | A1* | 5/2005 | Rayssac | H01L 21/76251 438/689 |
| 2007/0196999 | A1* | 8/2007 | Tamura | H01L 21/84 438/458 |
| 2009/0023295 | A1* | 1/2009 | Arita | H01L 21/3065 438/710 |
| 2012/0313241 | A1* | 12/2012 | Bower | H01L 21/563 257/737 |
| 2015/0008389 | A1* | 1/2015 | Hu | H01L 24/75 257/13 |
| 2015/0008566 | A1* | 1/2015 | Gerber | H01L 24/97 257/668 |
| 2015/0294843 | A1* | 10/2015 | Chen | H01J 37/32862 438/710 |
| 2016/0172253 | A1* | 6/2016 | Wu | H01L 33/62 438/15 |

(Continued)

*Primary Examiner* — Eric A. Ward
(74) *Attorney, Agent, or Firm* — Fenwick & West LLP

(57) ABSTRACT

A method of placing light emitting diodes (LEDs) includes embedding an array of LEDs in a polymer layer on a substrate. The method includes detaching at least one LED in the array of LEDs from the substrate by dry-etching the polymer layer in which at least one LED is embedded. A pick-up-tool (PUT) is brought into contact with at least one surface of at least one LED facing away from the substrate, responsive to dry-etching the polymer layer. The PUT is lifted with the at least one LED attached to the PUT.

17 Claims, 5 Drawing Sheets

(56) References Cited

U.S. PATENT DOCUMENTS

| | | | |
|---|---|---|---|
| 2017/0236811 A1* | 8/2017 | Pokhriyal | H01L 24/83 |
| | | | 257/91 |
| 2017/0373228 A1* | 12/2017 | Chang | H01L 33/44 |
| 2018/0286734 A1* | 10/2018 | Meitl | H01L 21/6835 |
| 2018/0374987 A1* | 12/2018 | Zou | H01L 21/6835 |
| 2020/0006108 A1* | 1/2020 | Brodoceanu | H05K 3/0026 |

* cited by examiner

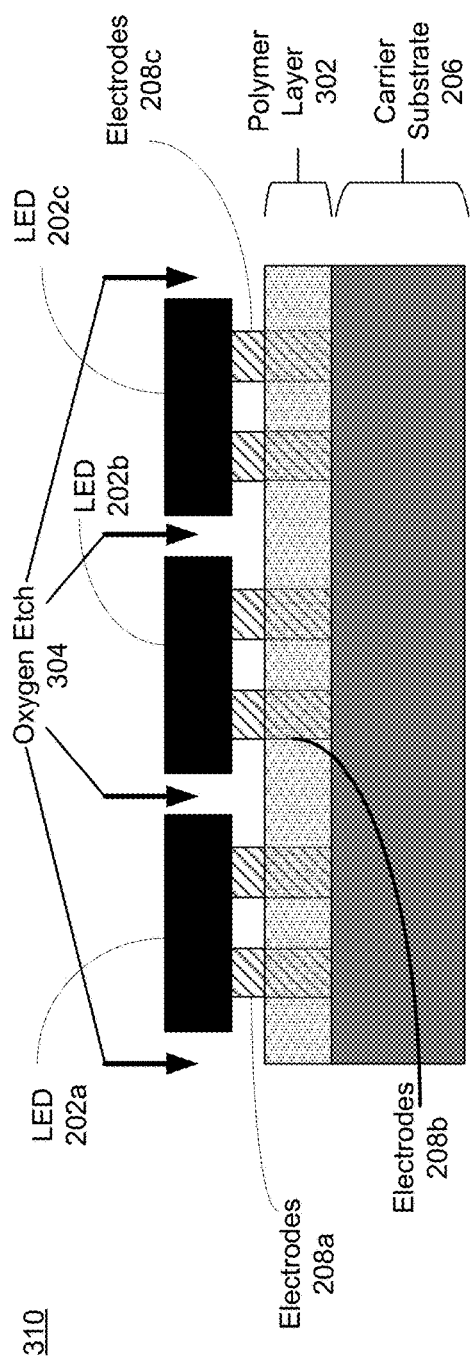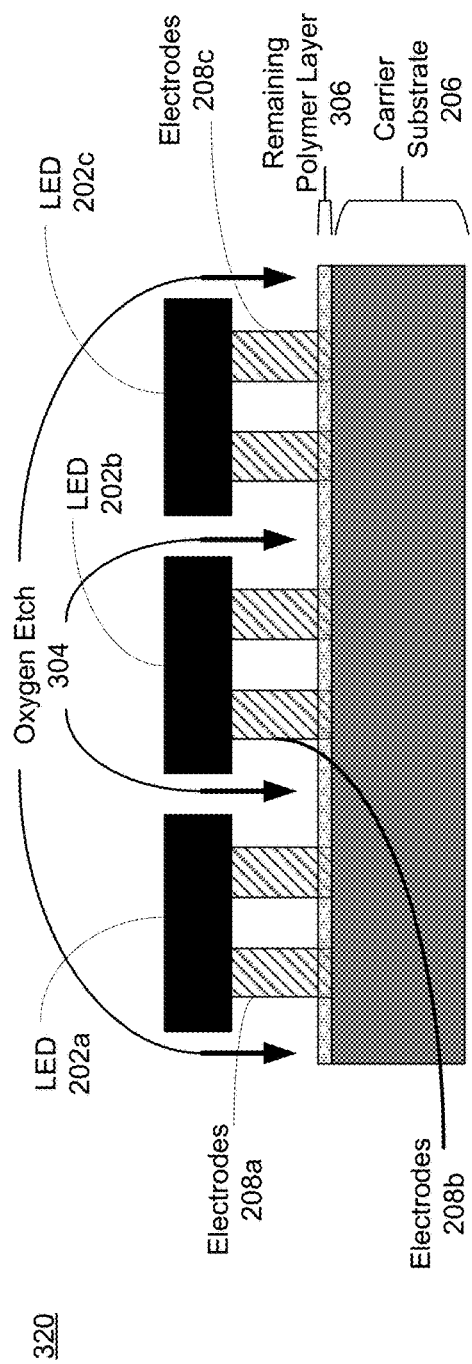
FIG. 3A
FIG. 3B

DRY-ETCHING OF CARRIER SUBSTRATE FOR MICROLED MICROASSEMBLY

BACKGROUND

Field of the Disclosure

The present disclosure relates to strategies for transferring semiconductor devices from a carrier substrate to a target substrate, and in particular to performing treatment on a polymer layer for securing the semiconductor devices onto the carrier substrate before transfer of the semiconductor devices from the carrier substrate to the target substrate.

Discussion of the Related Art

To populate a display with very small light emitting diodes (LEDs), such as micro-LEDs (μLED), the LEDs may be transferred from a carrier substrate on which they were manufactured or placed for processing to a final target substrate that forms part of a display, or "display substrate." Such small semiconductor devices may be assembled with a defined separation distance between them or closely packed together on the target substrate. Because of the small size of these devices, conventional pick-and-place techniques are unsuitable.

Many modifications have been proposed for improving pick-and-place of μLEDs. One strategy is to transfer semiconductor devices from their native substrates on which they are manufactured to a carrier substrate that includes a polymer layer. The polymer layer helps secure the semiconductor devices to the carrier substrate. However, a pick-and-place process relies on a Van der Waals force that forms between a pick up head and a pick up surface of the semiconductors. While the polymer layer helps secure and stabilize the semiconductors to the carrier substrate, it may prevent a pick up head from removing the semiconductor from the carrier substrate, since the Van der Waals force may not be strong enough to pull the semiconductor from the polymer layer. Conventional techniques for remedying this include heating the polymer layer above its glass transition temperature. However, this often results in damage to the semiconductors from the applied heat, as well as the formation of thin polymer threads from the polymer layer that travel with the semiconductor device when they are picked from the melted polymer layer. Both of these drawbacks result in lower semiconductor yield, and may inhibit bonding of the semiconductor devices to the target substrate.

SUMMARY

Embodiments relate to placing light emitting diodes from a carrier substrate to a target substrate. An array of LEDs is embedded in a polymer layer on a substrate. At least one LED in the array of LEDs is detached from the substrate by dry-etching the polymer layer in which the at least one LED is embedded, bringing a pick-up-tool (PUT) into contact with at least one surface of the at least one LED facing away from the substrate responsive to dry-etching the polymer layer, and lifting the PUT with the at least one LED attached to the PUT.

BRIEF DESCRIPTION OF THE DRAWINGS

Figure (FIG. 1) is schematic diagram illustrating a display assembly system, according to one embodiment.

FIGS. 3A and 3B are cross sectional diagrams illustrating dry-etching a polymer layer with embedded LEDs, according to one embodiment.

DETAILED DESCRIPTION

In the following description of embodiments, numerous specific details are set forth in order to provide more thorough understanding. However, note that the embodiments may be practiced without one or more of these specific details. In other instances, well-known features have not been described in detail to avoid unnecessarily complicating the description.

Embodiments are described herein with reference to the figures where like reference numbers indicate identical or functionally similar elements. Also in the figures, the left most digit of each reference number corresponds to the figure in which the reference number is first used.

Embodiments relate to dry-etching a polymer layer that secures LEDs onto a carrier substrate before transferring the LEDs from the carrier substrate to a target substrate. The polymer layer secures LEDs to the carrier substrate, such that the polymer layer stabilizes and prevents tilting of the LEDs as they are moved or otherwise prepared for a pick-and-place process. To pick up the LEDs with a pick-up-head tool, the polymer layer is dry-etched. In some embodiments, the resulting LED surfaces are then plasma treated to improve adhesion between the LED pick up surface and the pick-up head. The dry-etching can be performed at room temperature, and may avoid formation of polymer threads as a result of melting the polymer. A remaining polymer layer further helps stabilize the LEDs during the pick-and-place process itself and may prevent tilting of the LED pick-up surface.

Figure 1:
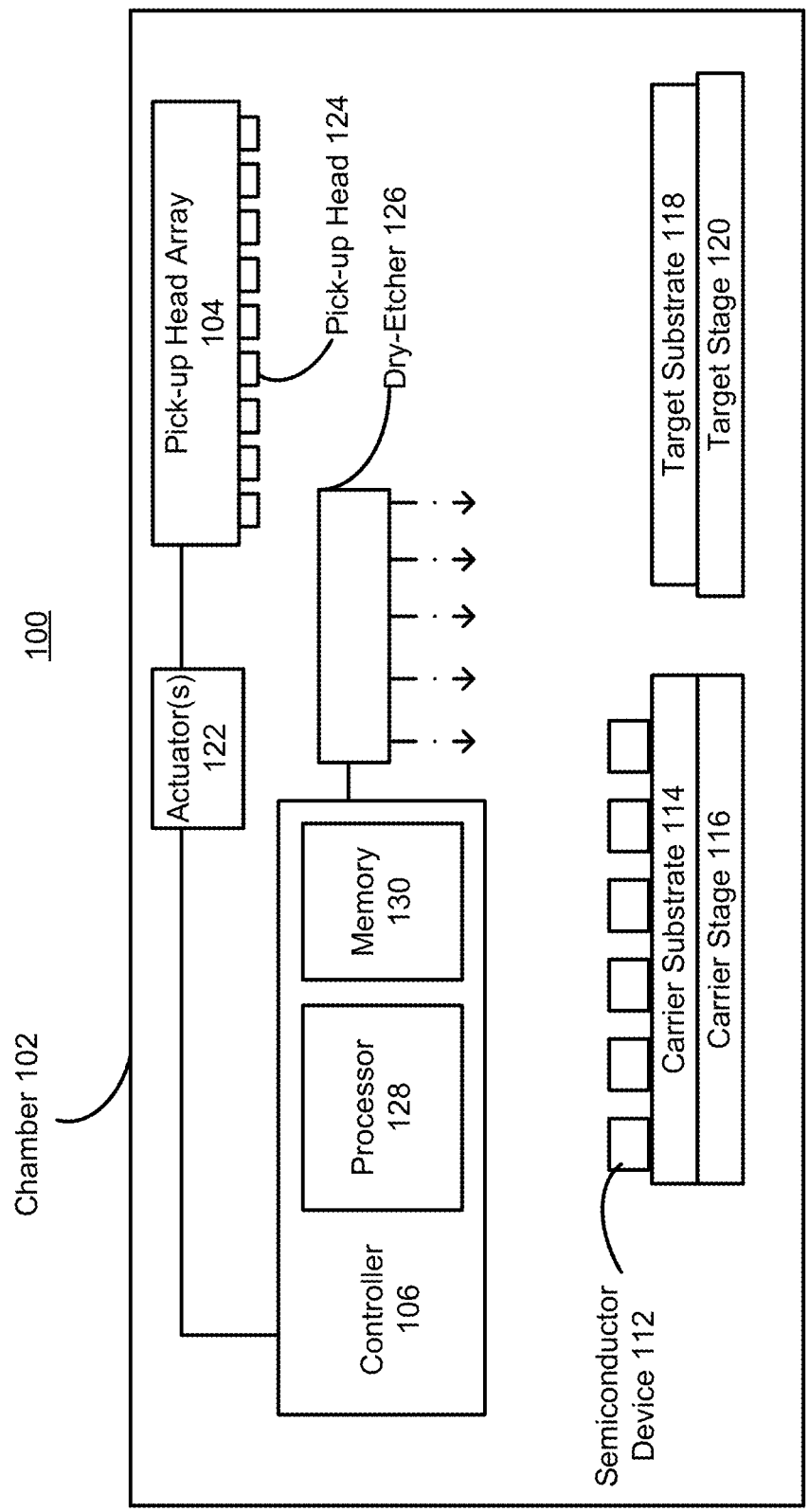

FIG. 1 is schematic diagram illustrating a display assembly system, according to one embodiment. The system 100 fabricates a display device through a pick-and-place technique. Specifically, the system 100 assembles semiconductor devices 112 by picking up micro-LEDs (μLEDs) from a carrier substrate 114 and places them onto a target substrate 118. In some embodiments, the semiconductor devices 112 are light emitting diode (LED) dies that emit different color. In some embodiments, the semiconductor devices 112 are different color μLEDs having a reduced divergence of light output and a small light emitting area. The carrier substrate 114 may be a carrier film that holds the semiconductor devices 112 for pick up by the pick-up head array 104. As described herein, the pick-up head array 104 or pick-up head is a PUT. In other embodiments, the carrier substrate 114 is the native substrate on which the semiconductor device 112 is grown. The carrier substrate 114 may be the carrier substrate 206 following dry-etching of a polymer layer, as described in further detail with reference to FIGS. 2-4.

The target substrate 118 may be a display substrate, or may be an intermediate carrier substrate that facilitates bonding with a display substrate. The system 100 places μLEDs at pixel locations of the display substrate, and then bonds the μLEDs to the display substrate.

As shown, the system 100 further includes a pick-up head array 104, an actuator 122, a carrier stage 116, and a target stage 120. The carrier stage 116 holds a carrier substrate 114 having semiconductor devices 112. The target stage 120 holds a target substrate 118 to receive some or all of the semiconductor devices 112 from the carrier substrate 114.

A controller 106 is coupled to the pick-up head array 104 (e.g., via the actuator 122) and controls the operations of the pick-up head array 104. For example, the controller 106 causes the pick-up head array 104 to pick up one or more semiconductor devices 112 located on a carrier substrate 114, and place the one or more semiconductor devices on the target substrate 118. The controller 106 may include, among other components, a memory 130 and a processor 128. The memory 130 stores instructions for operating the pick-up head array 104. The memory 130 may be any memory storage, such as an SRAM, DRAM, ROM, or any other computer memory storage. The processor 128 executes the instructions stored in the memory 130 and sends out the instructions to the pick-up head array 104 via a signal interface (not shown). The processor 128 executes the method described in further detail with reference to FIG. 5.

The pick-up head array 104 includes a plurality of pick-up heads 124. Each pick-up head 124 can pick up a semiconductor device 112 from the carrier substrate 114, and place the semiconductor device on the target substrate 118. After picking up a semiconductor device 112, the pick-up head 124 is aligned with a location on the target substrate 118.

The actuator 122 is an electro-mechanical component that controls the movement of the pick-up head array 104 based on instructions from the controller 106, as executed by the processor 128 from instructions stored in memory 130, and thus controls the transfer of the semiconductor device 112 from carrier substrate 114 and placement on the target substrate 118. For example, the actuator 122 may move the pick-up head array 104, or individual pick-up heads 124, with three degrees of freedom including up and down, left and right, and forward and back. In some embodiments, the pick-up head array 104 has more than three degrees of freedom. For example, the pick-up head array 104 may have six degrees of freedom, allowing for lateral motion up and down, left and right, and forward and back, as well as rotational motion along three different axes. The actuator 122 may be embodied, for example, as a rotating motor, a linear motor or a hydraulic cylinder.

The controller 106 aligns the one or more pick-up heads 124 with the display substrate 118, and places the semiconductor devices 112 attached to the one or more pick-up heads 124 on the display substrate 118.

The system 100 may include one or more carrier substrates 114. For example, different carrier substrates 114 may carry different color LED dies. A carrier substrate 114 may be carrier film that holds singulated semiconductor devices 112 for transfer to the display substrate 118. The system may include one or more target substrates 118. In some embodiments, such as when the target substrate 118 is the display substrate for receiving the semiconductor devices 112, the target stage 120 includes a heater for thermal conductive bonding of the electrical contact pads of the semiconductor devices 112 to the display substrate 118 subsequent to placement of the semiconductor devices 112 on the display substrate 118 by the pick-up head array 104. In other embodiments, the system 100 includes a laser system for laser bonding of the electrical contact pads of the semiconductor devices 112 to the display substrate 118 subsequent to placement of the semiconductor devices 112 on the display substrate 118 by the pick-up head array 104.

In some embodiments, the system 100 includes multiple pick-up head arrays 104 each positioned at a separate station. Each station may be dedicated to the pick-and-place of a particular color LED, such as a green station for green LEDs, a red station for red LEDs, and a blue station for blue LEDs, etc. Different colored LEDs are grown on different native substrates, which may be different carrier substrates 114 as shown in FIG. 1, due to differences in their composition and structure.

When the semiconductor devices 112 are µLEDs, creating enough Van der Waals force between the pick-up surface of the semiconductor devices 112 and the pick-up head 124 is important, since the small surface of the µLEDs reduces the surface area over which the Van der Waals interactions can occur. Furthermore, during movement of the carrier substrate 114, the semiconductor devices 112 are ideally secured, so that when the pick-up head 124 comes into contact with the pick-up surface of the semiconductor devices 112, the two surfaces align and there is minimal tilting of the semiconductor devices 112. Using a polymer layer on the carrier substrate 114 as described in FIGS. 2-4, the pick-and-place technique of system 100 can be used to successfully place µLEDs from the carrier substrate 114 to the target substrate 118.

In some embodiments, the force between the pick-up surface of the semiconductor devices 112 and the pick-up head 124 may be any adhesion force in addition to or other than a Van der Waals force. For example, the pick-up head 124 may include grippers that grip the semiconductor devices 112 and remove them from the carrier substrate 114. In other examples, the pick-up head 124 may pick up semiconductor devices 112 using electrostatic forces.

The system 100 includes a dry-etcher 126. The dry-etcher 126 etches a polymer surface (not shown) of the semiconductor device 112 on the carrier substrate 114 based on instructions received from the controller 106. The polymer surface is described in further detail with reference to FIGS. 2-5. The dry-etcher 126 etches the polymer surface without affecting the semiconductor structure of the semiconductor device 112. This is described in further detail with reference to FIG. 205. The dry-etcher 126 may be an oxygen dry-etcher, such as a Radio Frequency (RF) oxygen plasma reactor. The dry-etcher 126 may dry-etch a polymer surface of the semiconductor device 112 with any gas that selectively removes a polymer without affecting the semiconductor structure of the semiconductor device 112. For example, the dry-etcher may use air plasma or ammonia ($NH_3$). The dry-etcher 126 may include gas intake and gas out-take valves, ionizing plates, and any other standard dry-etching components.

Figure 2:
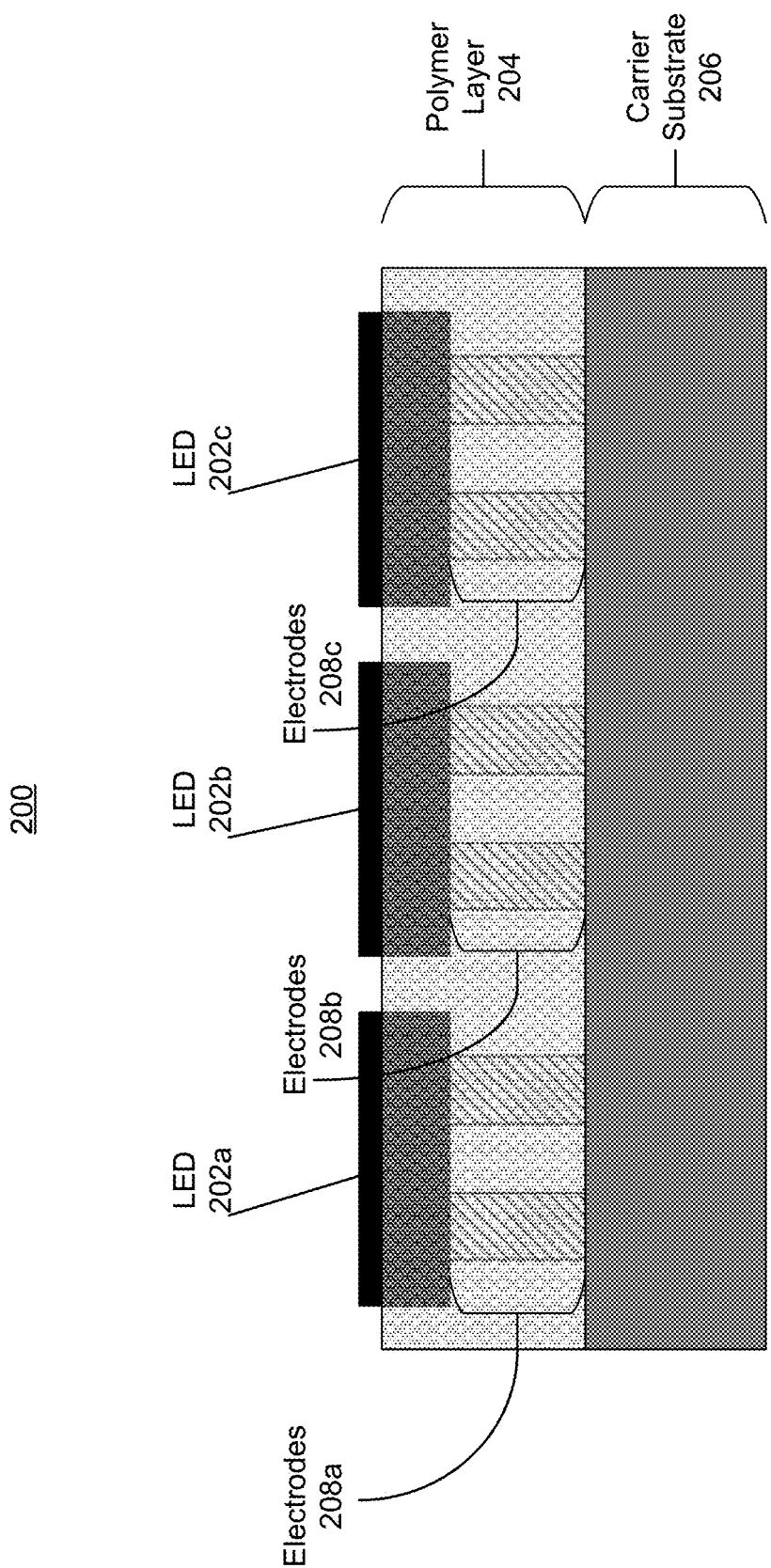
FIG. 2 is a cross sectional diagram of LEDs embedded in a polymer layer, according to one embodiment.

FIG. 2 is a cross sectional diagram of LEDs 202a, 202b and 202c embedded in a polymer layer 204 on a carrier substrate 206, according to one embodiment. The electrodes of the LEDs, electrodes 208a, 208b and 208c (collectively, electrodes 208), are embedded in the polymer layer 204.

The LEDs 202a, 202b and 202c (collectively, LEDs 202) may be µLEDs. The top of the LEDs 202 has a pick-up surface that comes in contact with a pick-up head, such as the pick-up head 124. The pick-up surface of the LEDs 202 is a surface of the LEDs 202 opposite or facing away from the carrier substrate 206. As shown in FIG. 2, there are three LEDs on the carrier substrate 206. However, there may be any number of LEDs transferred on the carrier substrate 206. As shown in FIG. 2, the LEDs 202 have a single layer, however the LEDs 202 may have any number of layers and/or internal structures (not shown). In some examples, the LEDs 202 may be grown on a separate native substrate (not shown) and the carrier substrate 206 is an intermediate substrate used to transfer the LEDs 202 for use in the pick-and-place technique of system 100. The separate native substrate may be a sapphire, GaN, GaAs, SiC, glass, or any other standard semiconductor substrate material. As shown in FIG. 2, the full semiconductor layer of LEDs 202 is not embedded in the polymer layer 204. However, the polymer layer 204 may have any desired thickness, such that the semiconductor layer of LEDs may be fully imbedded in the polymer layer 204. The LEDs 202 may be the semiconductor device 112 as shown in FIG. 1.

The electrodes 208 may be formed from any conductive material. Electrodes 208 are bonded to a target substrate, such as the target substrate 118, following removal of the LEDs from the carrier substrate 206 through a pick-and-place technique. Thus a conductive interface forms between the electrodes 208 and a target substrate, through which the LEDs 202 may be powered.

The polymer layer 204 may be formed from any polymer capable of being dry-etched. For example, the polymer layer 204 may be formed from polyvinyl alcohol (PVA), polyvinyl acetate (PVAC), polyester, polymethyl methacrylate (PMMA), polystyrene (PS), polycarbonate (PC), polyvinyl butyral (PVB), or any photoresist material used in a conventional lithography process. The polymer layer 204 secures the LEDs 202 as they are moved with the carrier substrate 206 during the pick-and-place technique of system 100. The polymer layer 204 may be thicker than the height of the electrodes 208. In some examples, the polymer layer 204 is between 3 and 10 µm thick. The polymer layer 204 may be epitaxially grown on the carrier substrate 206 following placement of the LEDs 202 on the carrier substrate 206. For example, the polymer layer 204 may be grown using Molecular Beam Epitaxy (MBE) or Metalorganic Chemical Vapor Deposition (MOCVD). As shown in FIG. 2, the polymer layer is a single layer, however in other examples, the polymer layer 204 may be formed from any number of layers of polymer materials.

The carrier substrate 206 may be glass, silicon, or any other suitable material. The carrier substrate 206 is the carrier substrate 114 as shown in FIG. 1, and is used to move the LEDs 202 during the pick-and-place operation of system 100.

With the polymer layer 204, the LEDs 202 are secured on the carrier substrate 206, reducing lateral shifting or tilt when the LEDs 202 come in contact with a pick-up-head during a pick-and-place technique of system 100, such as the pick-up head 124.

In some examples, one or more additional layers of non-semiconductor material may be formed over the surface of the LEDs 202. These additional layers may be used to adhere to a surface of the pick-up head 124, and thus facilitate the removal of the LEDs 202 from the carrier substrate 206. For example, the additional layer may be a conformable interface layer (clayer) formed from a conformable material that allows the LEDs 202 to be adhesively attached to the pick-up head 124.

FIGS. 3A and 3B are cross sectional diagrams 310 and 320 illustrating etching a polymer layer 302 with LEDs 202 mounted on a carrier substrate 206, according to one embodiment. Specifically, FIG. 3A illustrates performing of an initial oxygen etch 304 on the polymer layer 204. The oxygen etch 304 partially removes the polymer layer 204 only, resulting in the reduction of the thickness of the polymer layer from polymer layer 204 to polymer layer 302. The oxygen etch 304 may be done in a Radio Frequency (RF) oxygen plasma reactor. The oxygen etch 304 may be performed by the dry-etcher 126 based on instructions from the controller 106, as shown in FIG. 1. In other examples, the oxygen etch 304 is any form of dry-etching, such that the gas used may be air instead of oxygen, or any other dry-etching technique described in further detail with reference to FIG. 1. Following the oxygen etch 304, the structure of the LEDs 202 and carrier substrate 206 remain the same, and may be unaffected by the oxygen etch 304.

FIG. 3B illustrates the remaining polymer layer 306 after the full oxygen etch 304. In one or more embodiments, the oxygen etch 304 may be performed between 10 minutes to 4 hours, or any other time range necessary to result in the remaining polymer layer 306, which depends on the material forming the polymer layer 306. The oxygen etch 304 removes the polymer layer 204 until a thin layer remains, which is the remaining polymer layer 306. The remaining polymer layer 306 continues to stabilize the LEDs 202 during the pick-and-place technique of system 100, but does not prohibit the pick-up-head 124 from removing the LEDs 202 from the carrier substrate 206. Thus the force between the remaining polymer layer 306 and the LEDs is less than the Van der Waals force between a pick-up surface of the LEDs 202 and the pick-up head 124. In some examples, the remaining polymer layer 306 may be between a few nanometers to a few micrometers thick. In some embodiments, the remaining polymer layer 306 may have variable height, such that the height of the remaining polymer layer 306 is substantially the same height as the electrodes 208 where the remaining polymer layer 306 is near the electrodes 208, and less in areas between the LEDs 202. In other examples, the oxygen etch 304 may fully remove the polymer layer 204, such that the remaining polymer layer 306 no longer remains over the carrier substrate 206, resulting in a structure of only the LEDs 202, electrodes 208 and carrier substrate 206.

Following the full oxygen etch 304, the resulting structure, shown in cross section 320, may be used in a pick-and-place technique of system 100. In addition to the oxygen etch 304, the structure shown in cross section 320 may be plasma cleaned to improve the strength of the Van der Waals force that forms between the pick-up surface of the LEDs 202 and a pick-up head used in a pick-and-place technique of system 100. The plasma cleaning may be an oxygen plasma cleaning, such as a RF oxygen plasma. The plasma cleaning of the structure shown in cross-section 320 may be done before use of the cross-section 320 in a pick-and-place technique of system 100, as described in further detail below. In some examples, the surface of a PUT may also be plasma cleaned to improve the adhesion between the surface of the LEDs 202 and a PUT. In some examples, any standard additional surface functionalization techniques may be used on the surface of the LEDs 202 and/or a surface of a PUT to improve adhesion between the two surfaces.

Throughout the removal of the polymer layer 302 from the thickness of polymer layer 204 to the remaining polymer layer 306, the temperature of the polymer layers 204, 302 and 306 may be less than the glass transition temperature of the polymer material of the polymer layers 204, 302 and 306. In some examples, the temperature of the polymer layers 204, 302 and 306 may be room temperature.

Figure 4:
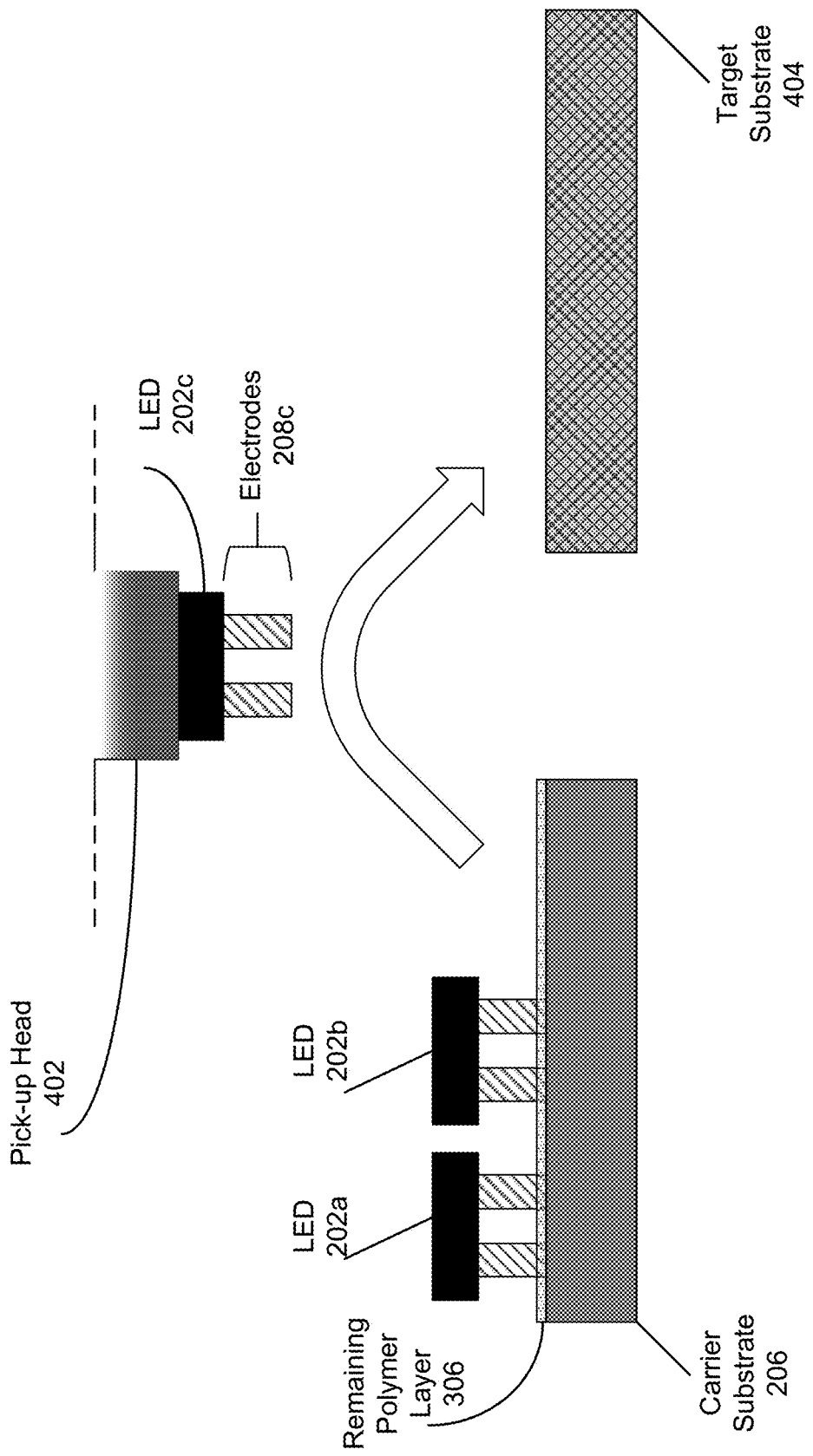
FIG. 4 is a diagram of the placement of LEDs onto a target substrate following etching of a polymer layer, according to one embodiment.

FIG. 4 is a diagram of the placement of LEDs 202 onto a target substrate following etching of a polymer layer, according to one embodiment. FIG. 4 shows a process of transferring LEDs from a carrier substrate to a target substrate using the structure formed through oxygen etching of the structure shown in cross section 200 of FIG. 2. The operation of FIG. 4 may be performed by the pick-up head array 104 of system 100, and is described above in further detail with reference to FIG. 1. The oxygen etching shown in FIGS. 3A-3B results in the structure shown in cross section 320. The LEDs 202 are moved from the carrier substrate 206 to a target substrate 404 with a pick-up head 402.

The pick-up head 402 comes into contact with a pick-up surface of LED 202c. A contact force, such as a Van der Waals force, forms between the pick-up surface of LED 202c and the pick-up head 402. The pick-up head is then lifted away from the carrier substrate 206. The LED 202c is removed from the remaining polymer layer 306 and the carrier substrate 206. The pick-up head 402 may then be maneuvered, with the LED 202c attached to the pick-up head 402, to a desired bonding position on the target substrate 404. The electrodes 208c are placed in contact with the surface of the target substrate 404. The electrodes 208c are then bonded to the surface of the target substrate 404, forming a conductive interface between the electrodes 208c and the target substrate 404. The bond between the electrodes 208c and the target substrate 404 may be formed through heating of the target substrate, or any other standard bonding technique, such as thermocompression bonding.

Any of the LEDs 202 located on the carrier substrate 206 may be selected by a pick-up head 402 for placement on the target substrate 404. For example, LED 202a may be removed from the remaining polymer layer 306 and the carrier substrate 206 and bonded to the target substrate 404. In some examples, the LEDs 202 may be removed from the carrier substrate 206 by the pick-up head 402 without the remaining polymer layer 306 over the carrier substrate 206.

Figure 5:
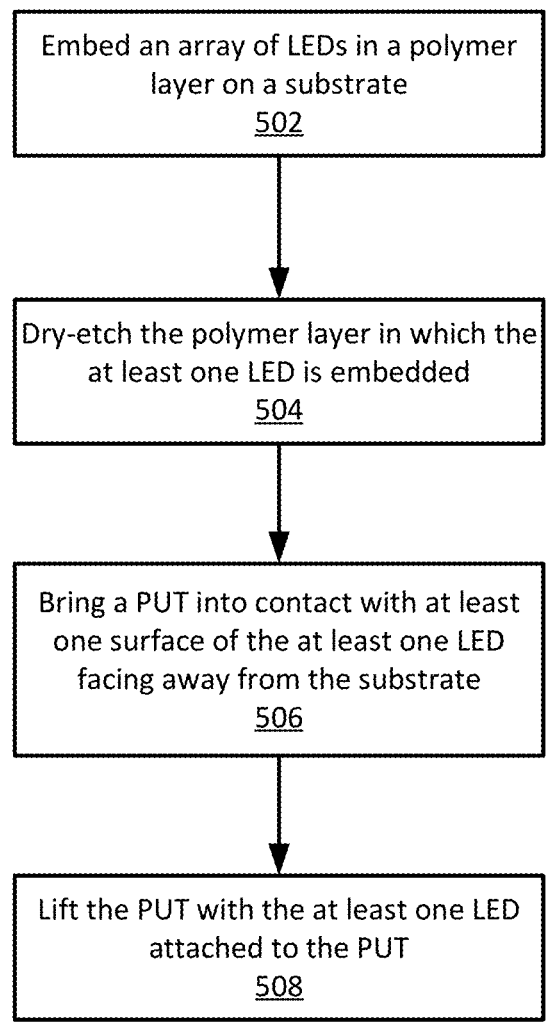
FIG. 5 is a flowchart of a method of transferring LEDs, according to one embodiment.

FIG. 5 a flowchart of a method of transferring LEDs, according to one embodiment. In some embodiments, the method may be executed by instructions stored in memory 130 and executed by the processor 128 of controller 106. An array of LEDs is embedded 502 in a polymer layer on a substrate. In some examples, the array of LEDs may be the semiconductor device 112 and/or the LEDs 202 as shown in FIGS. 1-4. In some examples, the polymer layer may be the polymer layer 204 as shown in FIG. 2. The substrate may be the carrier substrate 114 and/or carrier substrate 206 as shown in FIGS. 1-4.

To detach at least one LED in the array of LEDs from the substrate, the polymer layer in which the at least one LED is embedded is dry-etched 504. The dry-etching 504 may be done by the dry-etcher 126 as instructed by the controller 106 and described in further detail with reference to FIG. 1. Dry-etching 504 may be the oxygen etch 304 as described in further detail with respect to FIG. 3A-3B. As a result of the dry etching 504, a thickness of the polymer layer may be reduced. The polymer layer following dry-etching 504 may be the remaining polymer layer 306. A PUT is brought into contact 506 with at least one surface of the at least one LED facing away from the substrate. The PUT may be the pick-up head array 104, pick-up head 124, and/or the pick-up head 402 as described in further detail with reference to FIGS. 1 and 4, respectively. Contacting the PUT 506 with at least one surface of the at least one LED may be done as instructed by the controller 106 and described in further detail with reference to FIG. 1. The PUT is then lifted 508 with the at least one LED attached to the PUT. This may be the LED 202c removed from the carrier substrate 206 and attached to the pick-up head 402.

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method of transferring light emitting diodes (LEDs) comprising:
   embedding an array of LEDs in a polymer layer on a top flat surface of a flat substrate with electrodes of the LEDs protruding from surfaces of bodies of the LEDs facing towards the flat substrate and protruding through the polymer layer, the electrodes of the LEDs between the bodies of the LEDs and the flat substrate, and the polymer layer directly contacting the array of LEDs and the flat substrate; and
   detaching at least one LED in the array of LEDs from the flat substrate by:
      dry-etching the polymer layer in which the at least one LED is embedded,
      bringing a pick-up-tool (PUT) into contact with at least one surface of the at least one LED facing away from the flat substrate responsive to dry-etching the polymer layer, and
      lifting the PUT with the at least one LED attached to the PUT to detach the electrodes of the LEDs from the flat substrate.

2. The method of claim 1, wherein dry-etching the polymer layer in which the at least one LED is embedded comprises oxygen etching.

3. The method of claim 1, wherein the array of LEDs is an array of µLEDs.

4. The method of claim 1, wherein the polymer layer on the flat substrate is at a temperature below a glass transition temperature of the polymer layer during the dry-etching.

5. The method of claim 4, wherein the polymer layer on the flat substrate is at room temperature during the dry-etching.

6. The method of claim 1, further comprising, prior to bringing the PUT into contact with at least one surface of the at least one LED facing away from the flat substrate, plasma cleaning the array of LEDs in the polymer layer on the flat substrate.

7. The method of claim 6, wherein plasma cleaning the array of LEDs in the polymer layer on the flat substrate is a radio frequency (RF) oxygen plasma cleaning.

8. The method of claim 1, wherein the lifting of the PUT with the at least one LED attached to the PUT comprises:
   forming a Van der Waals interaction between the PUT and the at least one surface of the at least one LED facing away from the flat substrate.

9. The method of claim 1, wherein the flat substrate is glass.

10. A non-transitory computer-readable storage medium storing processor executable instructions, the instructions comprising instructions for:
    embedding an array of LEDs in a polymer layer on a top flat surface of a flat substrate with electrodes of the LEDs protruding from surfaces of bodies of the LEDs facing towards the flat substrate and protruding through the polymer layer, the electrodes of the LEDs between the bodies of the LEDs and the flat substrate, and the polymer layer directly contacting the array of LEDs and the flat substrate; and detaching at least one LED in the array of LEDs from the flat substrate by:
  dry-etching the polymer layer in which the at least one LED is embedded,
  bringing a pick-up-tool (PUT) into contact with at least one surface of the at least one LED facing away from the flat substrate responsive to dry-etching the polymer layer, and
  lifting the PUT with the at least one LED attached to the PUT to detach the electrodes of the LEDs from the flat substrate.

11. The computer readable medium of claim 10, wherein dry-etching the polymer layer in which the at least one LED is embedded comprises oxygen etching.

12. The computer readable medium of claim 10, wherein a sub-layer of the polymer layer remains on the flat substrate following dry-etching the polymer layer in which the at least one LED is embedded.

13. The computer readable medium of claim 10, wherein the polymer layer on the flat substrate is at a temperature below a glass transition temperature of the polymer layer.

14. The computer readable medium of claim 13, wherein the polymer layer on the flat substrate is at room temperature.

15. The computer readable medium of claim 10, further comprising, prior to bringing the PUT into contact with at least one surface of the at least one LED facing away from the flat substrate, plasma cleaning the array of LEDs in the polymer layer on the flat substrate.

16. The computer readable medium of claim 15, wherein plasma cleaning the array of LEDs in the polymer layer on the flat substrate is a radio frequency (RF) oxygen plasma cleaning.

17. The computer readable medium of claim 10, wherein the lifting the PUT with the at least one LED attached to the PUT comprises:
  forming a Van der Waals interaction between the PUT and the at least one surface of the at least one LED facing away from the flat substrate.

* * * * *